US007704326B2

(12) United States Patent
Hagiwara et al.

(10) Patent No.: US 7,704,326 B2

(45) Date of Patent: Apr. 27, 2010

(54) DEPOSITION MASK AND MANUFACTURING METHOD THEREOF

(75) Inventors: Nobuo Hagiwara, Kanagawa (JP); Hideo Nagasaki, Tokyo (JP); Tsutomu Mori, Aichi (JP); Tatsushiro Hirata, Kanagawa (JP); Hajime Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 383 days.

(21) Appl. No.: 11/004,335

(22) Filed: Dec. 2, 2004

(65) Prior Publication Data

US 2005/0115503 A1 Jun. 2, 2005

(30) Foreign Application Priority Data

Dec. 2, 2003 (JP) ........................... P2003-403655

(51) Int. Cl.
*C23C 16/00* (2006.01)
*C23C 16/04* (2006.01)

(52) U.S. Cl. ....................... 118/720; 118/721; 118/504; 118/505

(58) Field of Classification Search ................. 118/720, 118/721, 504, 505
See application file for complete search history.

(56) References Cited

U.S. PATENT DOCUMENTS 4,615,781 A * 10/1986 Boudreau .................. 427/96.8
5,226,382 A * 7/1993 Braden ....................... 118/406
5,669,972 A * 9/1997 Cox et al. ................... 118/504
5,876,880 A * 3/1999 Vonach et al. .................. 430/5
2003/0010749 A1* 1/2003 Yoshizawa et al. ............ 216/56
2005/0115503 A1* 6/2005 Hagiwara et al. ........... 118/721
2006/0110904 A1* 5/2006 Conrad ...................... 438/603

FOREIGN PATENT DOCUMENTS

JP 10-008239 1/1998
JP 2003-272838 9/2003

OTHER PUBLICATIONS

Japanese Office Action dated Mar. 31, 2009, for corresponding JP Patent Application 2003-403655.

* cited by examiner

*Primary Examiner*—Jeffrie R Lund
(74) *Attorney, Agent, or Firm*—K&L Gates LLP

(57) ABSTRACT

A deposition mask with which position precision of a passage hole is improved and deposition can be conducted precisely and a manufacturing method thereof are provided. A mask body made of a metal thin film is fixed and tightly mounted on a frame body having an opening. The mask body has at least one pattern region including a plurality of passage holes for letting through a deposition material, a stress relaxation region including a plurality of fine holes provided at the periphery of the pattern region, and a holding region provided at the periphery of the stress relaxation region. The mask body is tightly mounted on the frame body at a holding region.

20 Claims, 13 Drawing Sheets

20
60
T
30
50
51
T

DEPOSITION MASK AND MANUFACTURING METHOD THEREOF

CROSS REFERENCES TO RELATED APPLICATIONS

This application claims priority to Japanese Patent Application No. P2003-403655 filed on Dec. 2, 2003, the disclosure of which is incorporated by reference herein.

BACKGROUND OF THE INVENTION

The present invention relates to a deposition mask used for a deposition process in a manufacturing process of an electronic component, a semiconductor, a reflective film of an optical component, an organic light-emitting device and the like.

Conventionally, vacuum deposition method with a deposition mask is widely used for manufacturing an organic light-emitting device using a low molecular weight material. As shown in FIG. 1, the deposition mask has, for example, a construction wherein a mask body 120 made of a metal thin film is mounted at a certain tension on a frame body 110. The mask body 120 has a pattern region 130 consisting of plenty of passage holes 131 for letting through a deposition material.

However, with the conventional deposition mask, it is difficult to position the passage hole 131 at an appropriate place with sufficient accuracy when the mask body 120 is mounted on the frame body 110.

SUMMARY OF THE INVENTION

The present invention relates to a deposition mask used for a deposition process in a manufacturing process of an electronic component, a semiconductor, a reflective film of an optical component, an organic light-emitting device and the like. The present invention provides in an embodiment a deposition mask with which position precision of a passage hole can be improved and deposition can be conducted precisely and a manufacturing method thereof.

The deposition mask according to an embodiment includes a frame body having an opening; and a mask body made of a metal thin film, wherein the mask body has: a pattern region including a plurality of passage holes for letting through a deposition material; a stress relaxation region including a plurality of fine holes provided at the periphery of the pattern region, and a holding region provided at the periphery of the stress relaxation region, and the mask body is tightly mounted on the frame body at a holding region.

The method of manufacturing the deposition mask according to an embodiment includes forming a mask body by providing at least one pattern region by arranging a plurality of passage holes and by providing a stress relaxation region including a plurality of fine holes around the pattern region on a metal thin film; and tightly mounting the mask body on a frame body having an opening at a holding region located in the outside of the stress relaxation region.

Additional features and advantages of the present invention are described in, and will be apparent from, the following Detailed Description of the Invention and the figures.

DETAILED DESCRIPTION OF THE INVENTION

The present invention relates to a deposition mask used for a deposition process in a manufacturing process of an electronic component, a semiconductor, a reflective film of an optical component, an organic light-emitting device and the like.

Embodiments of the invention will be hereinafter described in detail with reference to the drawings.

Before a deposition mask according to an embodiment of the invention is described, first, a concrete example of a display unit manufactured by this mask will be hereinafter described.

Figure 3:
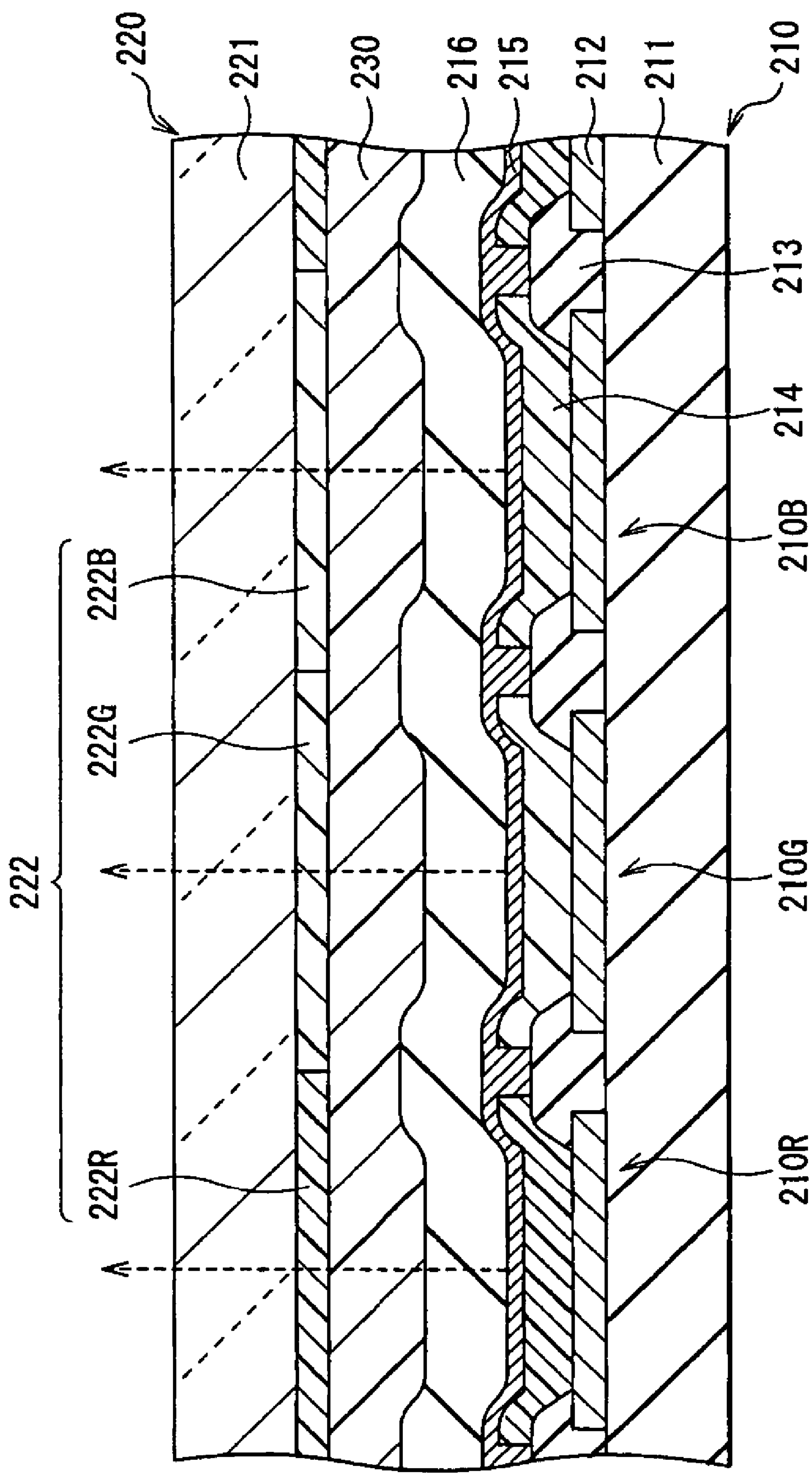
FIG. 3 is a plane view showing a construction of the display unit shown in FIG. 2.
Figure 4:
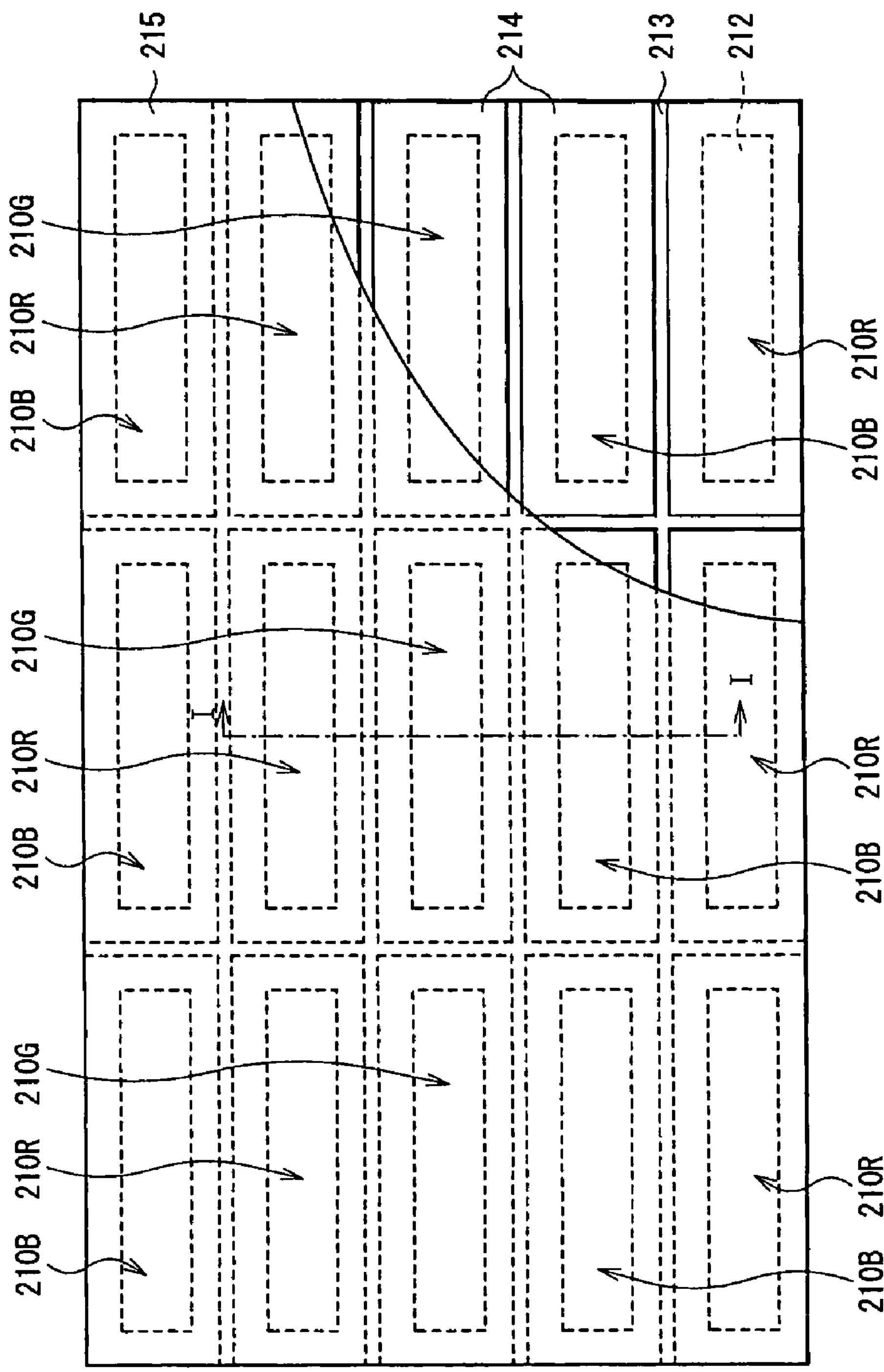
FIG. 4 is an oblique perspective figure showing a construction of the deposition mask according to an embodiment of the invention.

This display unit is used, for example, as an ultrathin organic light emitting display. As shown in FIG. 3, a driving panel 210 and a sealing panel 220 are placed opposite, and their whole faces are bonded together by an adhesive layer 230 made of, for example, a thermosetting resin. In the driving panel 210, for example, an organic light-emitting device 210R for emitting red light, an organic light-emitting device 210G for emitting green light, and an organic light-emitting device 210B for emitting blue light are orderly provided in a matrix state as a whole on a driving substrate 211 made of an insulating material such as glass. The organic light-emitting devices 210R, 210G, and 210B are, for example, as shown in FIG. 4, arranged so that rectangle organic light-emitting devices form a line in the longitudinal direction for every light emitting color.

In the organic light-emitting devices 210R, 210G, and 210B, for example, a first electrode 212 as an anode, an insulating film 213, an organic layer 214 including a light-emitting layer, and a second electrode 215 as a cathode are layered in this order from the driving substrate 211 side. On the second electrode 215, a protective film 216 made of silicon oxide ($SiO_2$), silicon nitride (SiN) or the like is formed according to need. Of the foregoing, the organic layer 214 including the light-emitting layer is formed by using the deposition mask according to an embodiment.

Constructions of the organic layer 214 vary according to the organic light-emitting devices 210R, 210G, and 210B, respectively. The organic layer 214 of the organic light-emitting devices 210R, 210G, and 210B has a structure wherein an electron hole transport layer, a light-emitting layer, and an electron transport layer are layered in this order from the first electrode 212 side. A function of the electron hole transport layer is to improve efficiency to inject electron holes into the light-emitting layer. The light-emitting layer generates light by recombination of electrons and electron holes by application of electric field. A function of the electron transport layer is to improve efficiency to inject electrons into the light-emitting layer. An example of component material for the electron hole transport layer of the organic light-emitting device 210R includes bis[(N-naphthyl)-N-phenyl] benzidine ($\alpha$-NPD). An example of component material for the light-emitting layer of the organic light-emitting device 210R includes 2,5-bis-[4-[N-(4-methoxyphenyl)-N-phenylamino]] stilbenzene-1,4-dica-bonitrile (BSB). An example of component material for the electron transport layer of the organic light-emitting device 210R includes 8-quinolinol aluminum complex ($Alq_3$). An example of component material for the electron hole transport layer of the organic light-emitting device 210B includes $\alpha$-NPD. An example of component material for the light-emitting layer of the organic light-emitting device 210B includes 4,4'-bis(2,2'-diphenyl vinyl)biphenyl (DPVBi). An example of component material for the electron transport layer of the organic light-emitting device 210B includes $Alq_3$. An example of component materials for the electron hole transport layer of the organic light-emitting device 210G includes $\alpha$-NPD. An example of component material for the light-emitting layer of the organic light-emitting device 210G includes a substance wherein 1 vol % of coumarin 6 (C6) is mixed with $Alq_3$. An example of component material for the electron transport layer of the organic light-emitting device 210G includes $Alq_3$.

The first electrode 212 also has a function as a reflective layer, and is made of a metal such as platinum (Pt), gold (Au), silver (Ag), chromium (Cr), tungsten (W) or, an alloy thereof and the like. The insulating film 213 is intended to secure insulation between the first electrode 212 and the second electrode 215, and accurately make a desired shape of light emitting regions in the organic light-emitting devices 210R, 210G, and 210B. The insulating film 213 is, for example, made of polyimide.

The second electrode 215 is made of a semi-transparent electrode. Light generated in the light-emitting layer is extracted from the second electrode 215 side. The second electrode 215 is made of a metal such as silver (Ag), aluminum (Al), magnesium (Mg), calcium (Ca), sodium (Na), an alloy thereof and the like.

The sealing panel 220 is located on the second electrode 215 side of the driving panel 210, and has a sealing substrate 221 for sealing the organic light-emitting devices 210R, 210G, and 210B with the adhesive layer 230. The sealing substrate 221 is made of a material such as glass which is transparent to light generated in the organic light-emitting devices 210R, 210G, and 210B. The sealing substrate 221 is, for example, provided with color filter 222 (222R, 222G, and 222B), so that the light generated in the organic light-emitting devices 210R, 210G, and 210B is extracted, outside light reflected in the organic light-emitting devices 210R, 210G, and 210B and wiring between them is absorbed, and contrast is improved.

Figure 1:
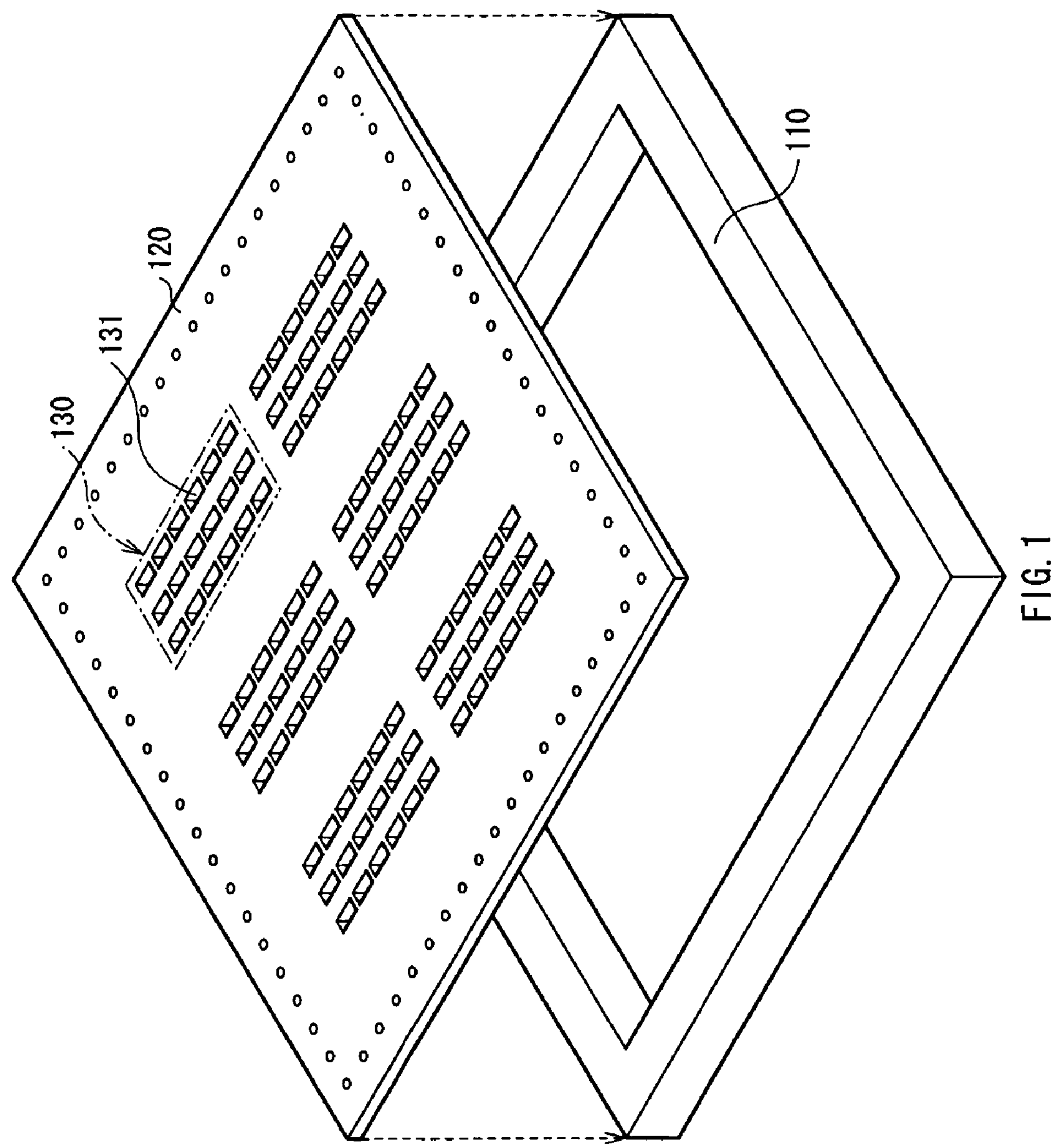
FIG. 1 is an oblique perspective figure showing a construction of a conventional deposition mask.
Figure 2:
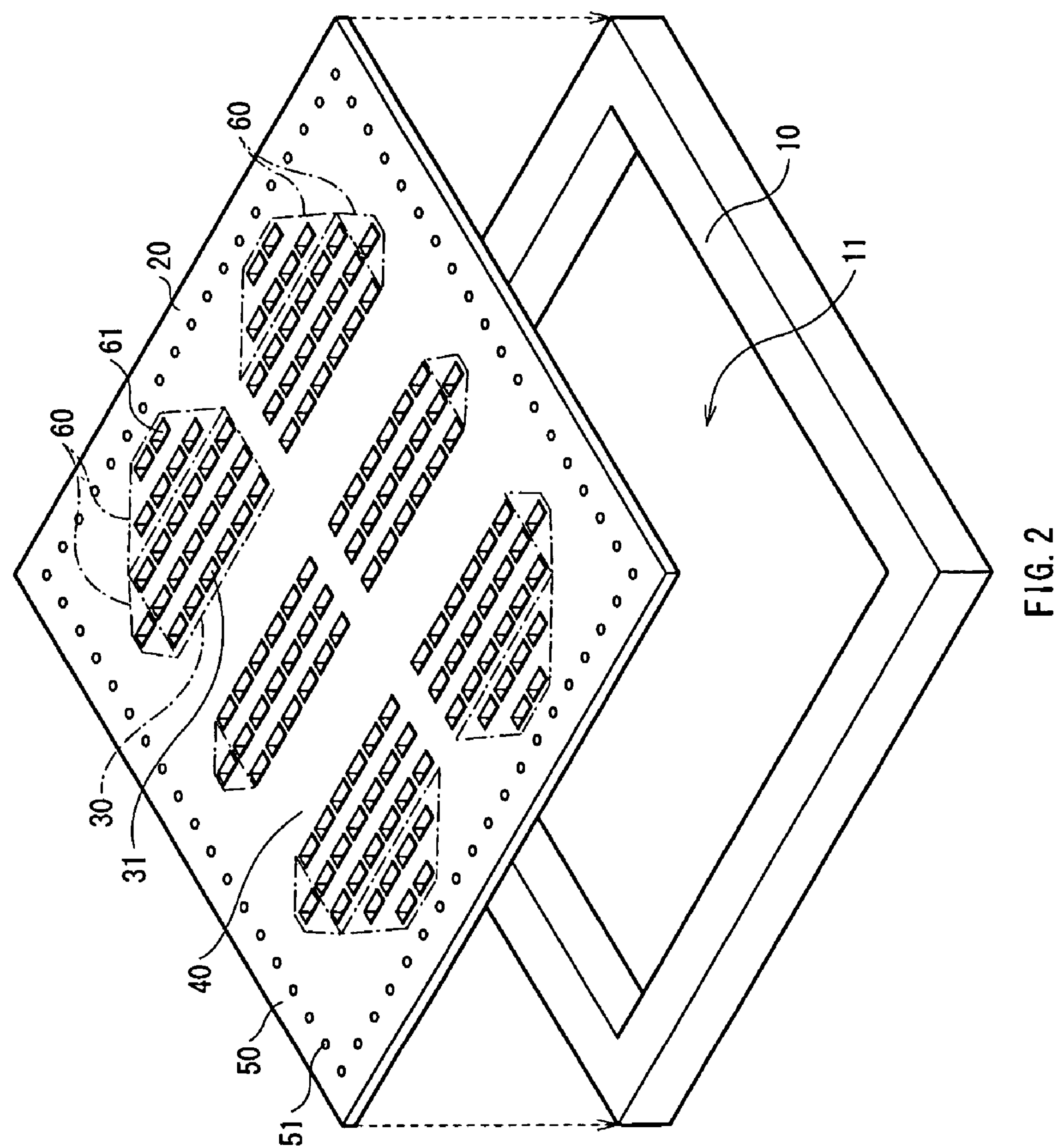
FIG. 2 is a cross sectional view showing a construction of a display unit manufactured by using a deposition mask according to an embodiment of the invention.

In an embodiment, the organic layer 214 of the foregoing organic light-emitting devices 210R, 210G, and 210B is formed for every color by vacuum deposition method using a deposition mask. The deposition mask according to an embodiment is, as shown in FIG. 2, a deposition mask wherein a mask body 20 made of a metal thin film is tightly mounted on a frame body 10 having an opening 11.

The frame body 10 is preferably made of a material having a linear heat expansion coefficient equal to of the driving substrate 211 on which the organic layer 214 is formed. The reason thereof is that along with temperature changes in deposition, the frame body 10 and the driving substrate 211 can be synchronously expanded or shrunk, and size variation of the frame body 10 and the driving substrate 211 due to expansion or shrinkage can become equal. Further, it is desirable that the frame body 10 has high rigidity and a sufficient thickness, and that the frame body 10 is designed by optimally adjusting heat capacity, surface radiation injection ratio, heat transfer amount which flows in/out due to heat conduction with a surrounding support medium (not shown), inflow calorie limited by an insulating board (not shown) blocking radiation heat from a deposition source (not shown) in addition to the linear heat expansion coefficient.

The mask body 20 is made of a metal thin film of, for example, a metal such as nickel (Ni) and copper (Cu) or an alloy thereof, or a rolled stainless steel, and the like. In the mask body 20, six pattern regions 30 that include a plurality of passage holes 31 are arranged as a whole in the shape of a rectangle in a state of, for example, two lines by three columns in a position corresponding to the opening 11 of the frame body 10. The organic layer 214 of six display units can be formed in the same deposition process. In each pattern region 30, the passage holes 31 which let through a deposition material for forming the organic layer 214 are arranged. These passage holes 31 are, for example, in the shape of a elongated hole, and are arranged, for example, in a state of six lines by three columns, so that the pattern region 30 is in the shape of a rectangle. Further, as shown in an enlarged view of FIG. 5, regarding these passage holes 31, distance L1 in the longitudinal direction of elongated holes is narrower than distance L2 in the direction perpendicular to the longitudinal direction, in order to form the organic layer 214 for every color in accordance with the arrangement of the organic light-emitting devices 210R, 210G, and 210B as shown in FIG. 3. A separation region 40 is provided between the pattern regions 30, in order to extract an electrode terminal and cut and separate respective display units.

The mask body 20 is fixed and tightly mounted on the frame body 10 at a continuous dot-shaped holding region 51 by, for example, electric resistance welding method in the periphery 50 of the pattern regions 30. Tension given to the mask body 20 is preferably set to a magnitude and a direction, so that a strain amount generated in the mask body 20 by heat stress due to radiation heat in deposition is offset by a strain amount generated in the mask body 20 due to the tension. If set so, heat expansion of a mask member 120 in deposition can be absorbed, and position precision of the passage hole 31 can be improved. Further, the tension given to the mask body 20 is more preferably adjusted finely according to locations of the mask body 20. If adjusted so, strain amounts of the mask body 20 can be uniformized by the pattern region 30 wherein plenty of the passage holes 31 are arranged, the separation region 40, and the periphery 50.

Further, the mask body 20 has a stress relaxation region 60 that includes a plurality of fine holes 61 between the pattern region 30 and the holding region 51. Therefore, when this deposition mask is used, stress belonging to the mask body 20 can be efficiently decentralized by the fine holes 61, and position precision of the passage hole 31 can be improved. It is not necessary that the fine holes 61 in the stress relaxation region 60 and the passage holes 31 of the pattern region 30 have the same shape, or are arranged with the same distance. Shapes and arrangement distances of the fine holes 61 and the passage holes 31 can be different from each other. However, it is preferable that the fine holes 61 and the passage holes 31 have the same shape and are arranged with the same distance as shown in FIG. 2, since a manufacturing process of the mask body 20 can be simplified.

In this embodiment, a position and a shape of the stress relaxation region 60 are set based on an analysis result of the stress of the mask body 20 tightly mounted on the frame body 10. Stress distribution of the mask body 20 varies according to the number and arrangement of the pattern regions 30, dimensions and arrangement of the passage holes 31 and the like. By setting the stress relaxation region 60 according to an actual design of the pattern region 30, higher effect can be obtained.

Further, it is possible to make an optimal size and an optimal shape of the fine hole 61 based on the analysis result of the stress of the mask body 20. For example, though not shown, this fine hole 61 can be a elongated hole (slit) radiating in all directions from a central part to the periphery 50 of the mask body 20.

Figure 5:
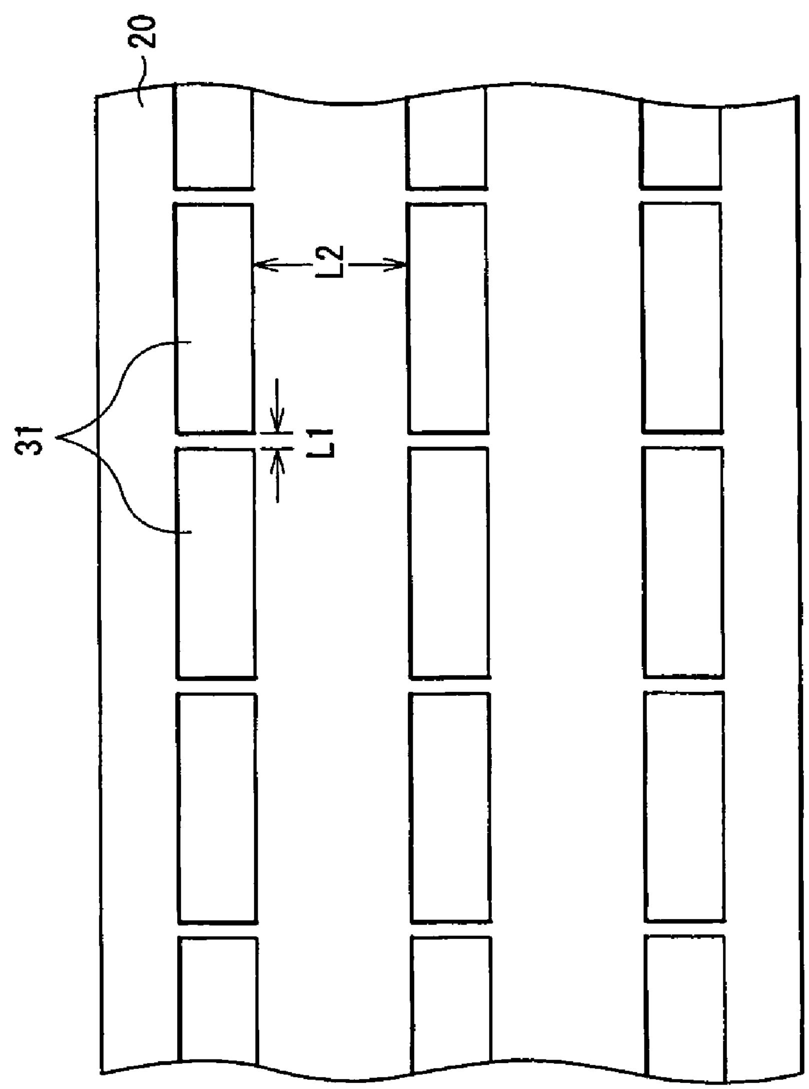
FIG. 5 is an enlarged plane view of passage holes shown in FIG. 4.
Figure 6:
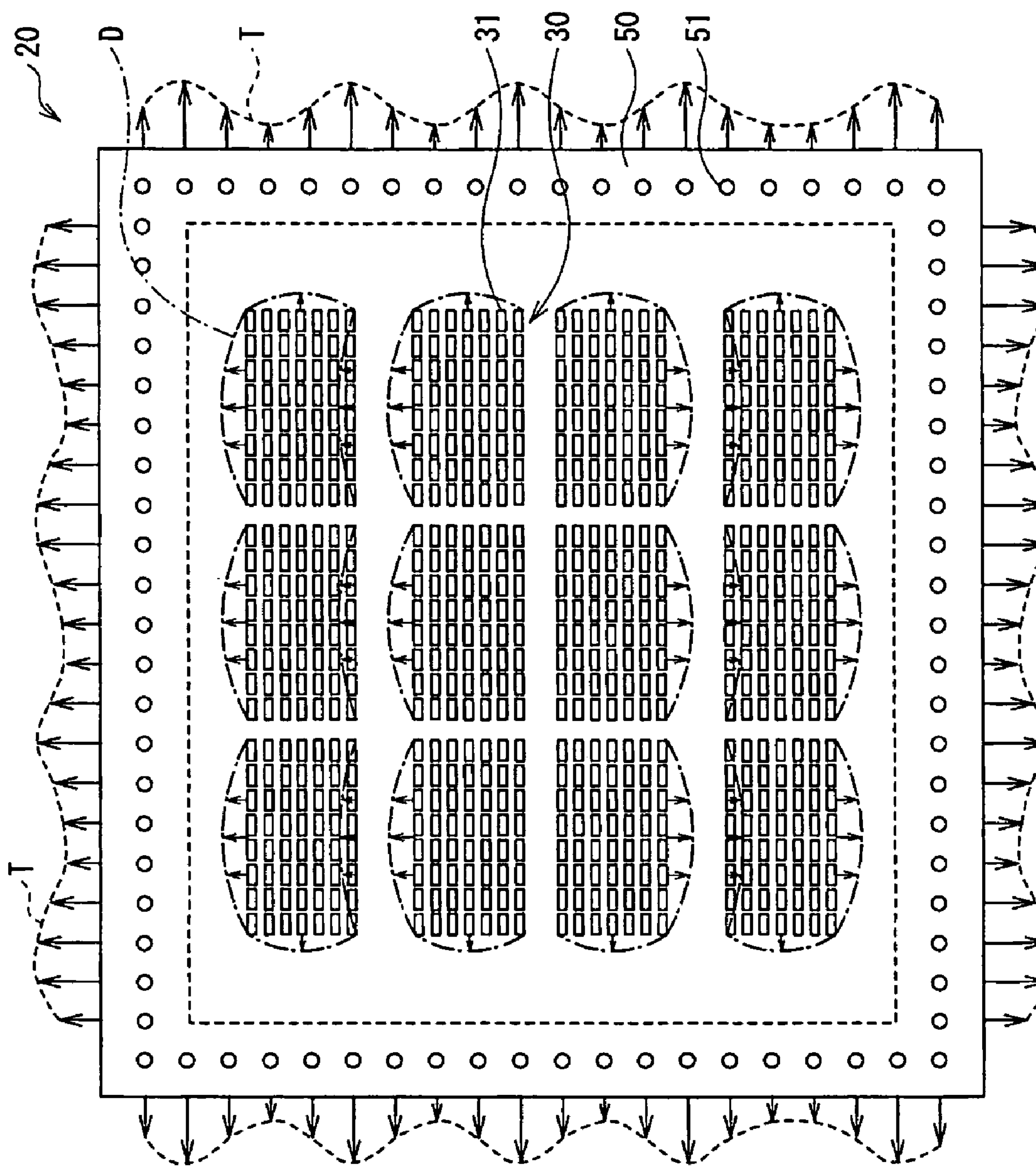
FIG. 6 is a plane view showing an example of a stress analysis result of a mask body shown in FIG. 4.

FIG. 6 shows an example of a stress analysis result of the mask body 20 in the case where the mask body 20 in which the pattern regions 30 are formed is given tension T and is fixed on the frame body 10. FIG. 6 shows a case wherein 12 pattern regions 30 are arranged as a whole in the shape of a rectangle in a state of four lines by three columns, the elongated hole shaped passage holes 31 are arranged in the shape of a rectangle in a state of seven lines by eight columns in each pattern region 30, and the distances L1 and L2 between the passage holes 31 are set as shown in FIG. 5. As described above, the tension T given to the mask body 20 is set to the magnitude and the direction, so that a strain amount generated in the mask body 20 by heat stress due to radiation heat in deposition is offset by a strain amount generated in the mask body 20 due to the tension. Further, the tension T is adjusted finely according to locations of the mask body 20. For example, the tension T is set to low magnitude in the pattern region 30 in which plenty of passage holes 31 are arranged, and the tension T is set to high magnitude in the separation region 40 and the periphery 50. In this case, for example, when stress of the mask body 20 is analyzed by using arithmetic process with finite element method, and deformation D in each pattern region 30 is calculated, each pattern region 30 is deformed in a state that each pattern region 30 is strained in the direction from the center of the mask body 20 to the periphery 50 of the mask body 20, and the deformation D is large in the center of sides of each pattern region 30. This deformation D cannot be completely inhibited by only uniformizing strain amounts of the mask body 20 by adjusting the tension T as mentioned above.

Figure 7:
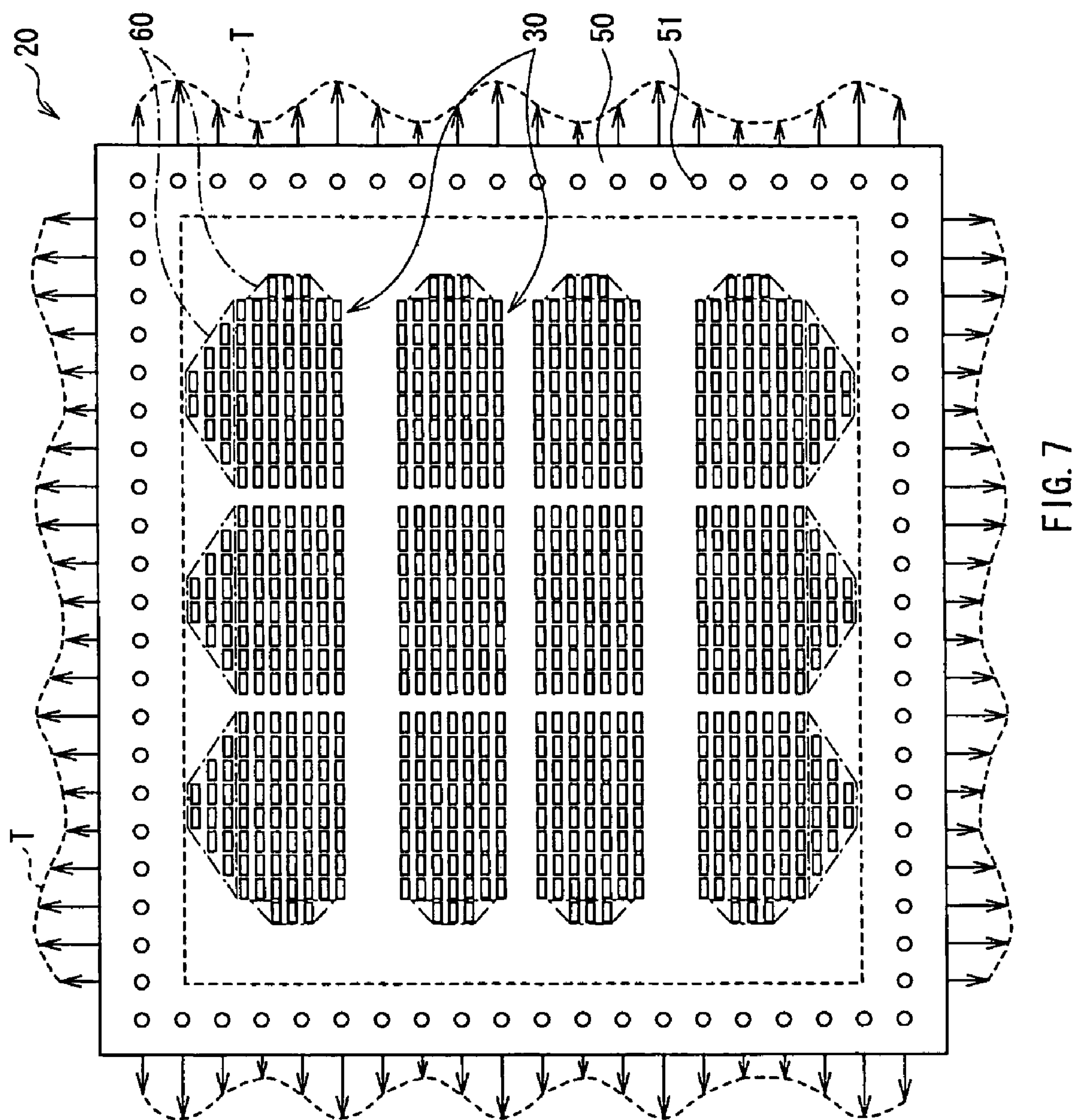
FIG. 7 is a plane view showing an example of stress relaxation regions based on the stress analysis result shown in FIG. 6.

FIG. 7 shows a setting example of the stress relaxation region 60 based on the stress analysis result shown in FIG. 6. According to the distribution of the deformation D shown in FIG. 6, the stress relaxation region 60 is in the shape of convexity such as an approximate triangle, which projects from the pattern region 30 side toward the holding region 51 side, facing to a side of the pattern region 30 on the periphery 50. By setting the stress relaxation region 60 according to the distribution of the deformation D based on the stress analysis result shown in FIG. 6 as above, the deformation D of the mask body 20 can be effectively inhibited.

FIG. 7 shows a case wherein the stress relaxation regions 60 are facing to a side parallel to the longitudinal direction of the passage holes 31 and a side perpendicular to the longitudinal direction of the passage holes 31 among sides of the pattern region 30. However, it is possible to only provide the stress relaxation region 60 facing to the side parallel to the longitudinal direction of the passage holes 31. The reason thereof is that the distance L1 in the longitudinal direction of the passage holes 31 is narrow, and therefore, the deformation D of the side parallel to the longitudinal direction of the passage holes 31 becomes particularly large. Another reason thereof is that the distance L2 in the direction perpendicular to the longitudinal direction of the passage holes 31 is relatively wide, and therefore, the deformation D of the side perpendicular to the longitudinal direction of the passage holes 31 is relatively small, and such deformation D of the side perpendicular to the longitudinal direction of the passage holes 31 can be inhibited by adjusting the tension T.

Figure 8:
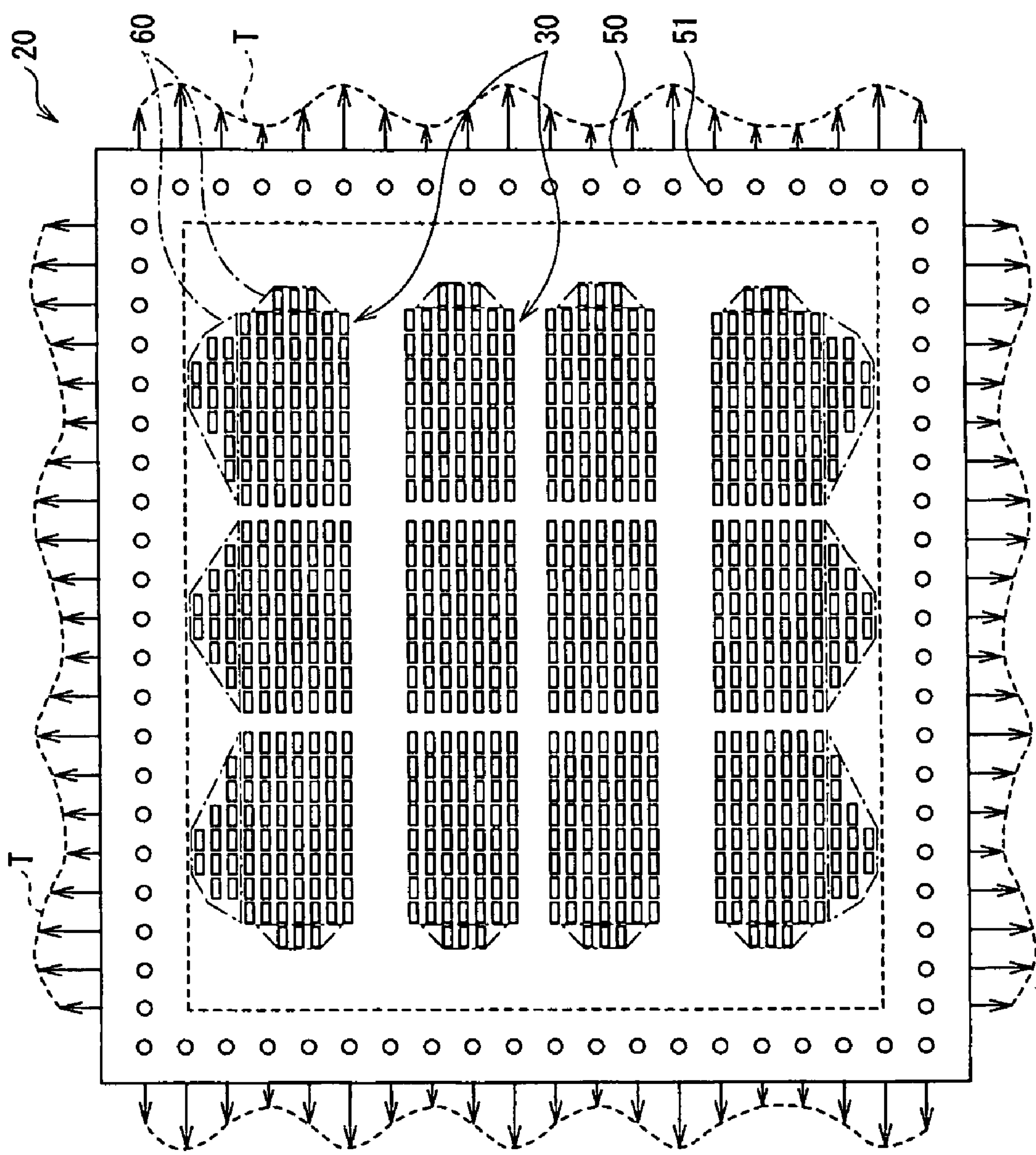
FIG. 8 is a plane view showing a modification of the stress relaxation regions shown in FIG. 7.
Figure 9:
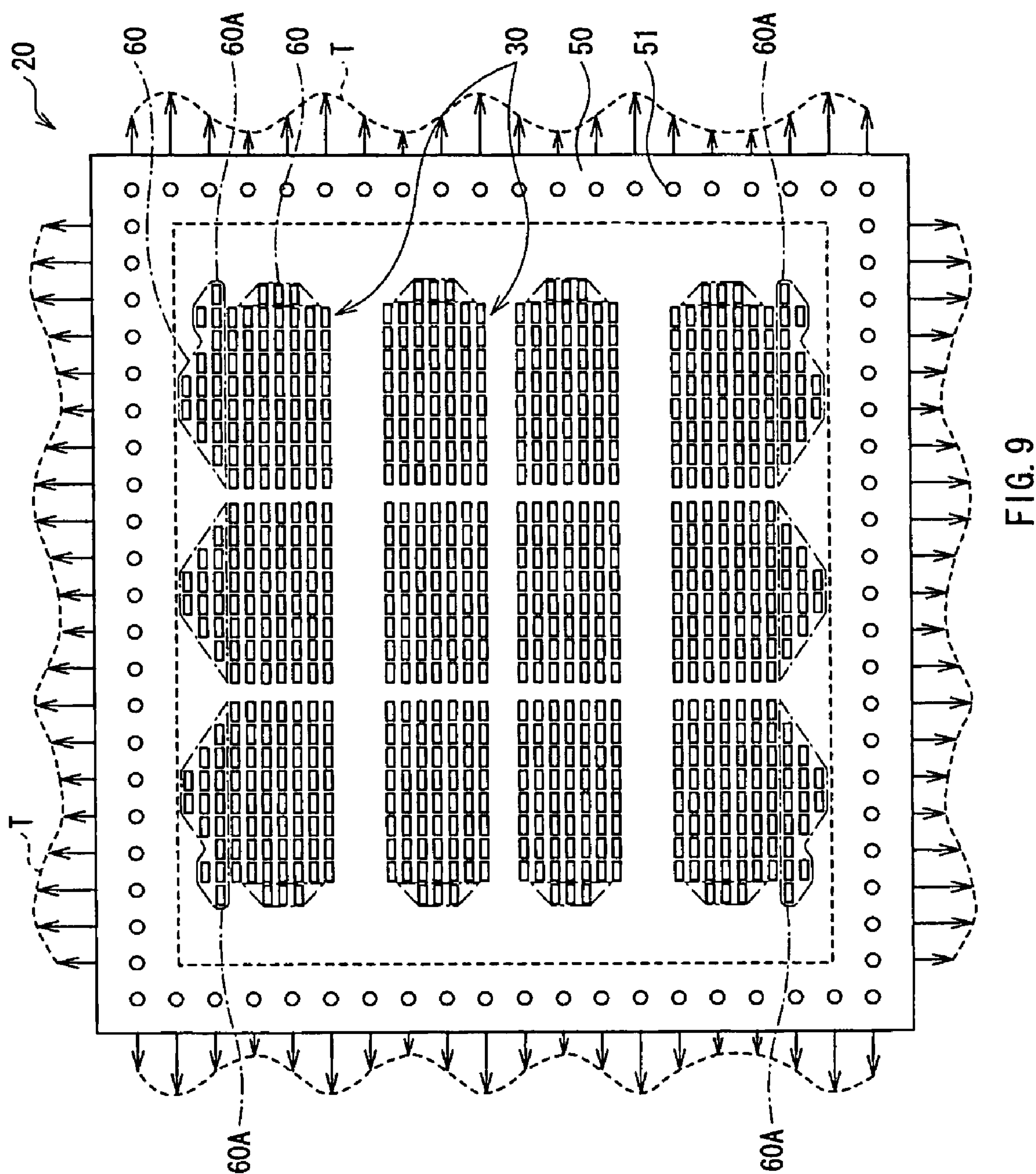
FIG. 9 is a plane view showing another modification of the stress relaxation regions shown in FIG. 7.

In particular, in the pattern regions 30 placed at four corners, it is more preferable that, for example, as shown in FIG. 8, the stress relaxation region 60 is in the shape of an approximate triangle tilted toward one end of a side of the pattern region 30, or it is more preferable that, for example, as shown in FIG. 9, the stress relaxation region 60 has an expansion region 60A surrounding a corner of the pattern region 30. The reason thereof is that there are no holes at the four corners of the periphery 50, and therefore, stress of the mask body 20 becomes particularly strong, and deformation of the pattern region 30 becomes particularly large. It is not necessary that all corners of the pattern region 30 are provided with the expansion region 60A. It is enough that only corners of the pattern region 30 near the four corners of the periphery 50 are provided with the expansion region 60A. It is not necessary that a whole of a corner of the pattern region 30 is surrounded by the expansion region 60A. It is enough that at least part of the corner of the pattern region 30 is surrounded by the expansion region 60A as shown in FIG. 9.

The deposition mask can be, for example, manufactured as follows. First, stress of the mask body 20 tightly mounted on the frame body 10 is analyzed by, for example, arithmetic process with finite element method. Here, it is preferable that a strain amount of the mask body 20 due to the tension T and a strain amount of the mask body 20 due to heat stress in deposition are analyzed. Analysis order is not particularly limited. It is possible that first the strain amount due to the heat stress is analyzed, and then the strain amount due to the tension T is analyzed. It is also possible that first the strain amount due to the tension T is analyzed, and then the strain amount due to the heat stress is analyzed. Further, deformation of the frame body 10 may arise by fixing the mask body 20 on the frame body 10. Therefore, it is possible that a deformation amount, a deformation direction, and deformation distribution of the frame body 10 are similarly analyzed by the arithmetic process with finite element method.

After the stress of the mask body 20 is analyzed, the stress relaxation region 60 is set based on this stress analysis result. Here, in the case where the deformation amount, the deformation direction, and the deformation distribution of the frame body 10 are similarly analyzed by the arithmetic process with finite element method, it is possible to set the stress relaxation region 60 by considering the analysis result thereof.

After the stress relaxation region 60 is set, the mask body 20 having the pattern region 30 and the stress relaxation region 60 is formed of a metal thin film made of the foregoing material by using, for example, electric plating.

After the mask body 20 is formed, the frame body 10 made of the foregoing material is prepared. Then, the mask body 20 is fixed and tightly mounted on the frame body 10 at the continuous dot-shaped holding region 51 by, for example, electric resistance welding method. Consequently, the deposition mask shown in FIG. 4 is completed.

In this deposition mask, a deposition material from the unshown deposition source passes through the passage holes 31 of the pattern region 30, and the organic layer 214 is formed on the driving substrate 211. Here, the stress relaxation region 60 that includes the plurality of fine holes 61 is provided between the pattern region 30 and the holding region 51. Therefore, the strain generated in the mask body 20 due to the tension given to the mask body 20, the heat stress due to the radiation heat in deposition and the like is effectively decentralized by the fine holes 61, and position precision of the passage holes 31 becomes high. Consequently, the organic layer 214 is formed on the first electrode 212 with a high degree of position precision, and luminance variation, color shift and the like of the organic light-emitting devices 210R, 210G, and 210B can be inhibited.

As above, in this embodiment, the mask body 20 is provided with the stress relaxation region 60 that includes the plurality of fine holes 61 between the pattern region 30 and the holding region 51. Therefore, the strain generated in the mask body 20 due to the tension given to the mask body 20, the heat stress due to the radiation heat in deposition and the like can be effectively decentralized by the fine holes 61, and position precision of the passage holes 31 can be improved. Consequently, the organic layer 214 can be formed with a high degree of position precision, luminance variation, color shift and the like of the organic light-emitting devices 210R, 210G, and 210B can be inhibited, and a display unit with a superior display quality can be realized.

Figure 10:
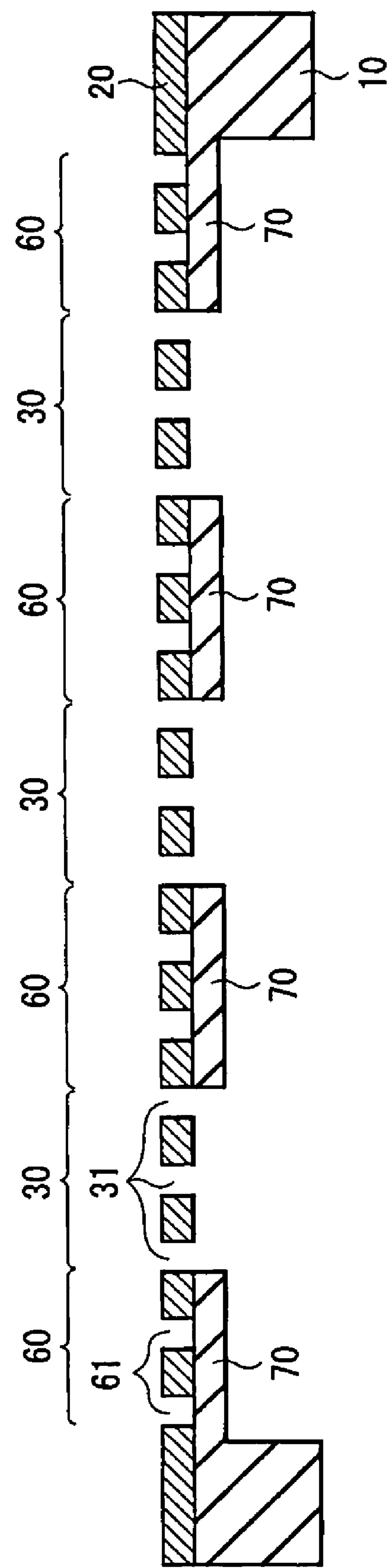
FIG. 10 is a cross sectional view showing a construction of a deposition mask according to another embodiment of the invention.

FIG. 10 shows a cross sectional construction of a deposition mask according to an embodiment of the invention. This deposition mask has the same construction as of the deposition mask discussed above, except that a shielding member 70 for covering the stress relaxation region 60 of the mask body 20 is provided. Therefore, the same components are provided with the same symbols as of the deposition mask previously discussed, and descriptions thereof will be omitted.

The shielding member 70 is, for example, made of the same material as of the frame body 70, and is formed integrally with the frame body 10. The shielding member 70 is formed in a state of a thin plate inside the opening 11. The shielding member 70 covers the stress relaxation region 60 and the separation region 40.

In this deposition mask, a deposition material from the unshown deposition source passes through the passage holes 31 of the pattern region 30, and the organic layer 214 is formed on the first electrode 212 formed on the driving substrate 211. Here, the stress relaxation region 60 is covered with the shielding member 70. Therefore, the deposition material does not pass through the fine holes 61 of the stress relaxation region 60, and the organic layer 214 is never formed in unintended locations on the driving substrate 211, such as a region for extracting an electrode terminal.

As above, in this embodiment, the mask body 20 is provided with the shielding member 70 for covering the stress relaxation region 60. Therefore, it is possible to prevent the unnecessary organic layer 214 from being formed in unintended locations on the driving substrate 211, such as the region for extracting an electrode terminal, and it is possible to inhibit lowering of characteristics of the organic light-emitting devices 210R, 210G, and 210B. Further, the shielding member 70 reflects heat radiated from the deposition source, or conducts the heat radiated from the deposition source to the frame body 10. Therefore, heat received by the mask body 20 can be inhibited, and thus temperature rise of the mask body 20 can be inhibited. Consequently, position precision of the passage hole 31 can be further improved.

Figure 11:
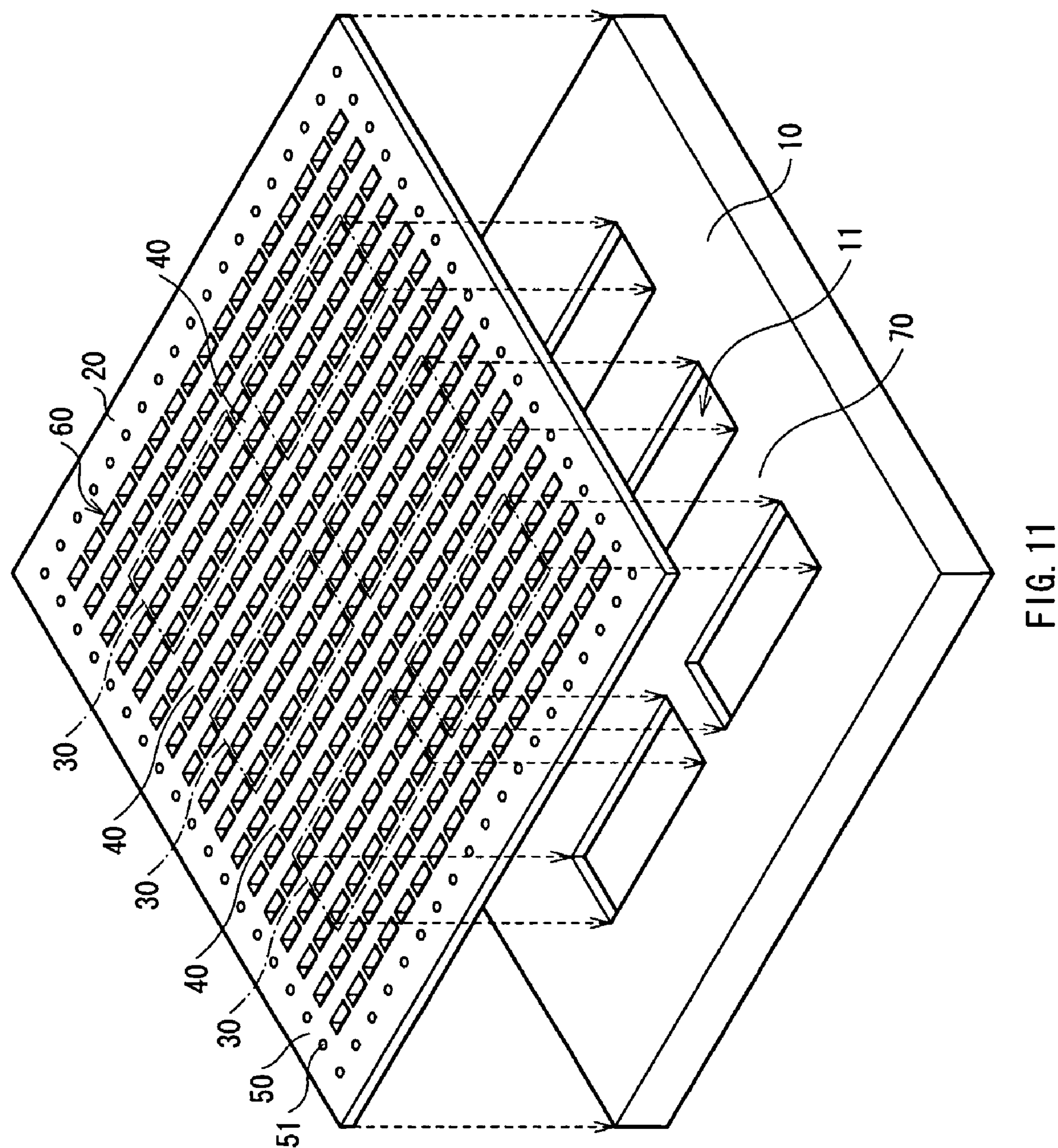
FIG. 11 is an oblique perspective figure showing a modification of the deposition mask shown in FIG. 10.

In this embodiment, as shown in FIG. 11, it is possible that one stress relaxation region 60 is provided over a whole of the pattern region 30 on an approximately whole area of the mask body 20. If provided so, distribution of the passage holes 31 and the fine holes 61 of the mask body 20 can be uniformized. Therefore, stress distribution of the mask body 20 can be uniformized, and position precision of the passage hole 31 can be further improved.

Figure 12:
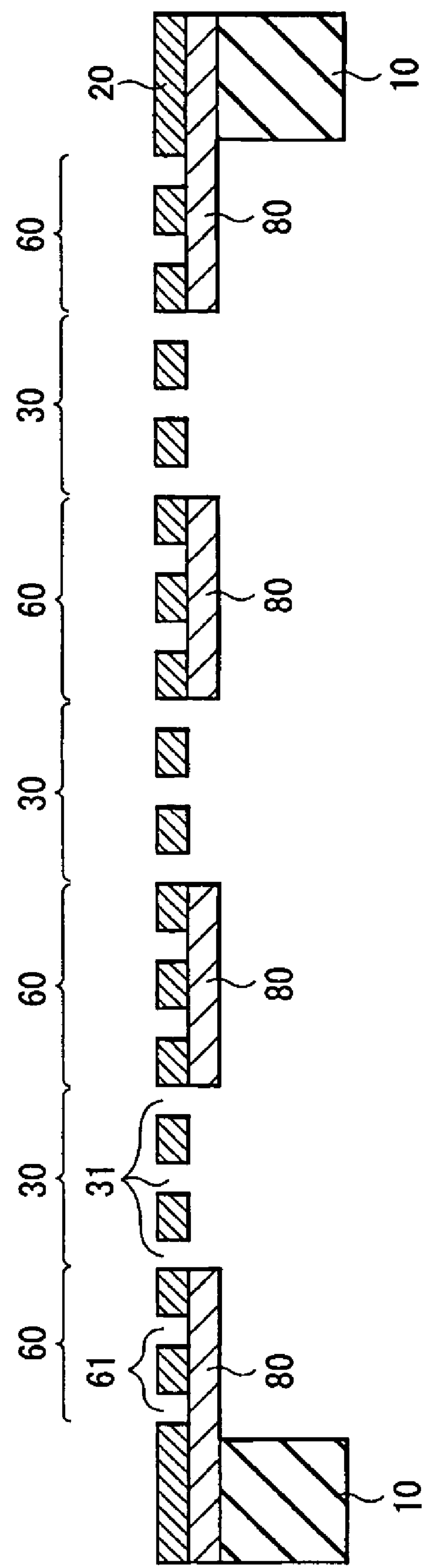
FIG. 12 is a cross sectional view showing another modification of the deposition mask shown in FIG. 10.

Further, in this embodiment, descriptions have been given of the case wherein the shielding member 70 is formed integrally with the frame body 10. However, as shown in FIG. 12, it is also possible that a shielding member 80 as an auxiliary mask formed separately from the frame body 10 is arranged between the frame body 10 and the mask body 20. When the shielding member 80 is provided separately from the frame body 10 as above, the frame body 10 can be a common shape regardless of shapes of the pattern region 30 for deposition.

The shielding member 80 is, for example, formed in the state of a thin plate made of the same material as of the frame body 10 or the mask body 20. In particular, when the shielding member 80 is made of a metal thin film, it is possible to reduce an area of a region wherein a deposition material is hard to be adhered since the deposition material diagonally injected from the deposition source is hidden behind the shielding member 80. In the result, it becomes possible to provide a uniform thickness of the organic layer 214 of the periphery of the pattern region 30.

The shielding member 80 and the mask body 20 are fixed and tightly mounted on the frame body 10 by, for example, electric resistance welding method in the state that the shielding member 80 and the mask body 20 are layered in this order from the frame body 10 side. Here, though not shown, it is preferable that a continuous dot-shaped holding region for fixing the mask body 20 and a continuous dot-shaped holding region for fixing the shielding part 80 are formed in respective positions shifted inside or outside from each other. The reason thereof is that if formed so, the mask body 20 and the shielding member 80 can be separately fixed on the frame body 10 in a manufacturing process.

A position of the shielding member 80 is not always limited to a clearance between the mask body 20 and the frame body 10. For example, when it is desired to provide a clearance between the mask body 20 and the driving panel 210 in deposition, it is possible that the mask body 20 and the shielding member 80 are fixed on the frame body 10 in the state that the mask body 20 and the shielding member 80 are layered in this order from the frame body 10 side, though not shown. Further, when the frame body 10 and the shielding member 80 are separately constructed as above, it is possible that the pattern region 30 and the stress relaxation region 60 are provided over the approximately whole area of the mask body 20, though not shown.

As described above, in the embodiment of the invention, the stress relaxation region that includes the plurality of fine holes is provided between the pattern region and the holding region. As a result, stress generated in the mask body 20 can be efficiently decentralized by the fine holes, and position precision of the passage hole can be improved. Thereby, deposition precision is significantly improved. In particular, when the position and the shape of the stress relaxation region are set based on the analysis result of stress of the mask body having the pattern region, higher effect can be obtained.

While the invention has been described with reference to the embodiments, the invention is not limited to the foregoing embodiments, and various modifications may be made. For example, in the foregoing embodiments, descriptions have been given of the case wherein the passage hole 31 is in the shape of an elongated hole as an example. However, the invention can be applied to a case wherein the passage hole 31 is in other shape such as a triangle, a trapezoid, an oval, a rectangle with round corners and the like. In such case, the stress relaxation region 60 can be set correspondingly to the shape of the passage hole 31.

Figure 13:
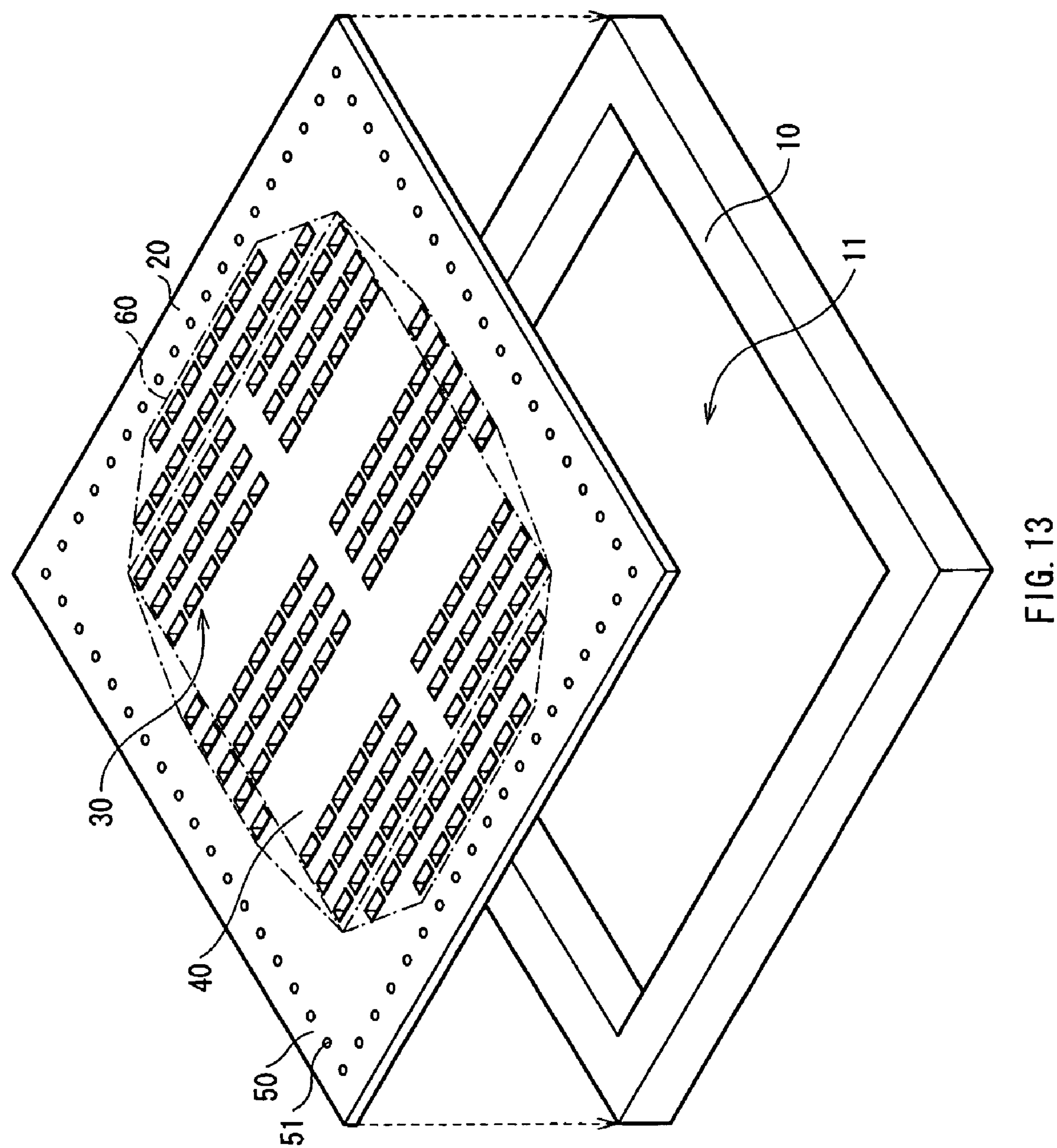
FIG. 13 is an oblique perspective figure showing a modification of stress relaxation regions shown in FIG. 4.

Further, for example, in the foregoing embodiments, as shown in FIG. 4, the case wherein each pattern region 30 is separately provided with the stress relaxation region 60, for example, has been described. However, it is possible that one continuous stress relaxation region 60 is provided over a whole of the plurality of pattern regions 30, for example, as shown in FIG. 13.

Further, for example, in the foregoing embodiments, the case wherein the mask body 20 has the plurality of pattern regions 30 has been described. However, it is enough that at least one pattern region 30 exists.

In addition, for example, in an embodiment, the case wherein the separation region 40 is not provided with the stress relaxation region 60 has been described. However, it is possible that part or all of the separation region 40 is provided with the stress relaxation region 60 according to need.

Further, for example, in the foregoing embodiments, the case wherein the mask body 20 is fixed on the frame body 10 at the continuous dot-shaped holding region 51 by the electric resistance welding method has been described. However, it is possible that the mask body 20 is fixed by other welding method such as laser welding. Further, it is possible that the mask body 20 is fixed on the frame body 10 by an adhesive having high stability to temperature changes, such as a heat resistant ceramics adhesive and a heat resistant epoxy resin adhesive. Further, it is possible that the mask body 20 is fixed on the frame body 10 by a fastening such as a screw.

Further, materials, thickness, deposition methods, and deposition conditions for each layer are not limited to those described in the foregoing embodiments, and other materials, thicknesses, deposition methods, and deposition conditions can be applied.

Further, though in the foregoing embodiments, the constructions of the organic light-emitting devices 210R, 210G, and 210B have been specifically described, not all the layers such as the insulating film 213 should be provided, and other layers can be further provided.

Further, in the foregoing embodiments, descriptions have been given of the case wherein the deposition mask of the invention is applied to forming the organic layer 214 of the display unit including the organic light-emitting devices 210R, 210G, and 210B. However, the invention can be applied to a manufacturing process of an electronic component, a semiconductor, a reflective film of an optical component, an integrated circuit and the like.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A deposition mask comprising:

a frame body having an opening; and a mask body that includes a metal thin film, wherein the mask body includes at least one pattern region including a plurality of passage holes through which a deposition material can pass, a stress relaxation region including a plurality of stress relaxation holes provided about an outer perimeter of the at least one pattern region, and a holding region provided at an outer side of the stress relaxation region, wherein the plurality of stress relaxation holes provided in the stress relaxation region are arranged in a pattern about the outer perimeter of the at least one pattern region to correspond to a degree of deformation of the mask body in the stress relaxation region, and the pattern is determined based on a stress analysis result of the mask body determined by a finite element analysis method, wherein a density of the stress relaxation holes in the stress relaxation region is larger in areas corresponding to greater analyzed stress and smaller in areas corresponding to lesser analyzed stress, and wherein the mask body is mounted on the frame body at the holding region so that the pattern region is located inside the opening of the mask body.

2. A deposition mask according to claim 1, wherein a position and a shape of the stress relaxation region are determined based on a result of the stress analysis generated in the mask body that is mounted on the frame body.

3. A deposition mask according to claim 1 wherein the stress relaxation region is in the shape of an approximate triangle.

4. A deposition mask according to claim 1, wherein the pattern region is in a shape of a rectangle, and the stress relaxation region surrounds a corner of the pattern region.

5. A deposition mask according to claim 1, wherein the passage hole is an elongated hole, and a distance between the passage holes in a longitudinal direction thereof is less than a distance between the passage holes in a direction perpendicular to the longitudinal direction, and wherein the stress relaxation region is facing to a side parallel to the longitudinal direction among sides of the pattern region.

6. A deposition mask according to claim 1, wherein a size and a shape of the stress relaxation holes are set based on a result of a stress analysis generated in the mask body mounted on the frame body.

7. A deposition mask according to claim 1, wherein a plurality of pattern regions are included and the plurality of pattern regions are arranged in the shape of a rectangle as a whole.

8. A deposition mask according to claim 7, wherein one stress relaxation region is provided for a whole of the plurality of pattern regions.

9. A deposition mask according to claim 7, wherein one stress relaxation region is provided for each of the pattern regions.

10. A deposition mask according to claim 7, wherein the stress relaxation region is further provided between the plurality of pattern regions.

11. A deposition mask according to claim 1, wherein a shielding member for covering the stress relaxation region is provided in a position corresponding to the stress relaxation region of the mask body.

12. A deposition mask according to claim 1, wherein the pattern region is used for forming an organic layer of a display unit using an organic light-emitting device in which a first electrode, the organic layer including a light-emitting layer, and a second electrode are layered in sequence on a substrate.

13. A deposition mask according to claim 1, wherein the stress relaxation holes in the stress relaxation region and the holes in the pattern region have the same shape.

14. A deposition mask according to claim 1, wherein the stress relaxation holes in the stress relaxation region and the holes in the pattern region are arranged in rows and columns, and wherein the pitch of the stress relaxation holes in the stress relaxation region is the same as the pitch of the holes in the pattern region.

15. A deposition mask according to claim 1, wherein each of the stress relaxation holes in the stress relaxation region are spaced apart the same distance as the holes in the pattern region.

16. A deposition mask according to claim 1, wherein the stress relaxation holes in the stress relaxation region immediately adjacent to the pattern region are positioned away from the pattern by a distance substantially equal to a spacing distance between holes in the pattern region.

17. A deposition mask according to claim 1, wherein the mask body includes a plurality of pattern regions arranged in rows and columns, a first pattern region having a first side that is longer than a second side, and for the first pattern region a number of stress relaxation holes provided in a first stress relaxation region adjacent to the first side is greater than a number of stress relaxation holes provided in a second stress relaxation region adjacent to the second side.

18. A deposition mask according to claim 17, wherein the number of stress relaxation holes provided in the second stress relaxation region is zero.

19. A deposition mask according to claim 17, wherein in the first stress relaxation region, the stress relaxation holes are provided in a pattern in the shape of an approximate triangle skewed toward one end of aside of the first pattern region.

20. A deposition mask according to claim 17, wherein the plurality of pattern regions include four corner pattern regions, and the stress relaxation region includes four expansion regions where one of the expansion regions is positioned at an outermost corner of each of the corner pattern regions, and wherein each of the expansion regions includes a plurality of stress relaxation holes.

* * * * *